US 9,276,112 B2

(12) United States Patent
Bohr

(10) Patent No.: US 9,276,112 B2
(45) Date of Patent: Mar. 1, 2016

(54) SEMICONDUCTOR DEVICE HAVING TIPLESS EPITAXIAL SOURCE/DRAIN REGIONS

(71) Applicant: Mark T. Bohr, Aloha, OR (US)

(72) Inventor: Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 13/886,939

(22) Filed: May 3, 2013

(65) Prior Publication Data

US 2013/0240950 A1 Sep. 19, 2013

Related U.S. Application Data

(62) Division of application No. 11/748,376, filed on May 14, 2007, now Pat. No. 8,450,165.

(51) Int. Cl.
*H01L 29/737* (2006.01)
*H01L 29/78* (2006.01)
*H01L 29/04* (2006.01)
(Continued)

(52) U.S. Cl.
CPC .......... *H01L 29/7848* (2013.01); *H01L 29/045* (2013.01); *H01L 29/66545* (2013.01); *H01L 29/66628* (2013.01); *H01L 29/66636* (2013.01); *H01L 29/66795* (2013.01); *H01L 29/785* (2013.01); *H01L 29/7834* (2013.01);
(Continued)

(58) Field of Classification Search
CPC . H01L 29/7848; H01L 29/045; H01L 29/165; H01L 29/66545; H01L 29/66628; H01L 29/66636; H01L 29/66795; H01L 29/7834; H01L 29/785; H01L 29/7378; H01L 21/845; H01L 27/886; H01L 27/0924
USPC ............. 257/282, 369, 410, E21.675, E27.06
See application file for complete search history.

(56) References Cited

U.S. PATENT DOCUMENTS 6,632,735 B2 * 10/2003 Yau et al. ....................... 438/623
6,921,913 B2    7/2005 Yeo et al.
(Continued)

FOREIGN PATENT DOCUMENTS

JP    2004031753    1/2004
JP    2007-103654    4/2007
WO   WO-2006/104529   10/2006

OTHER PUBLICATIONS

International Search Report and Written Opinion for Application No. PCT/US2008/062597, mailed Oct. 15, 2008, 10 pgs.
(Continued)

*Primary Examiner* — Galina Yushina
(74) *Attorney, Agent, or Firm* — Blakely, Sokoloff, Taylor & Zafman LLP

(57) ABSTRACT

A semiconductor device having tipless epitaxial source/drain regions and a method for its formation are described. In an embodiment, the semiconductor device comprises a gate stack on a substrate. The gate stack is comprised of a gate electrode above a gate dielectric layer and is above a channel region in the substrate. The semiconductor device also comprises a pair of source/drain regions in the substrate on either side of the channel region. The pair of source/drain regions is in direct contact with the gate dielectric layer and the lattice constant of the pair of source/drain regions is different than the lattice constant of the channel region. In one embodiment, the semiconductor device is formed by using a dielectric gate stack placeholder.

18 Claims, 16 Drawing Sheets

(51) Int. Cl.
*H01L 29/66* (2006.01)
*H01L 21/84* (2006.01)
*H01L 29/165* (2006.01)

(52) U.S. Cl.
CPC ............. *H01L21/845* (2013.01); *H01L 29/165* (2013.01); *H01L 29/7378* (2013.01)

(56) References Cited

U.S. PATENT DOCUMENTS

| | | |
|---|---|---|
| 6,960,781 B2 | 11/2005 | Currie et al. |
| 7,078,742 B2 | 7/2006 | Lin et al. |
| 7,112,495 B2 | 9/2006 | Ko et al. |
| 7,518,196 B2 * | 4/2009 | Chau et al. ............ 257/401 |
| 2003/0060018 A1 * | 3/2003 | Hsu ..................... 438/424 |
| 2004/0070035 A1 | 4/2004 | Murthy et al. |
| 2004/0262683 A1 | 12/2004 | Bohr et al. |
| 2005/0130454 A1 | 6/2005 | Murthy et al. |
| 2005/0184345 A1 | 8/2005 | Lin et al. |
| 2005/0224800 A1 * | 10/2005 | Lindert et al. ............ 257/66 |
| 2005/0253200 A1 | 11/2005 | Murthy et al. |
| 2005/0285212 A1 | 12/2005 | Tolchinsky et al. |
| 2006/0046399 A1 | 3/2006 | Lindert et al. |
| 2006/0046523 A1 | 3/2006 | Kavalieros et al. |
| 2006/0138552 A1 * | 6/2006 | Brask et al. ............ 257/369 |
| 2006/0205167 A1 | 9/2006 | Kavalieros et al. |
| 2006/0220119 A1 | 10/2006 | Lin |
| 2007/0004123 A1 * | 1/2007 | Bohr et al. ............ 438/230 |
| 2007/0010051 A1 | 1/2007 | Wu et al. |
| 2007/0023795 A1 | 2/2007 | Nagano et al. |
| 2008/0242032 A1 * | 10/2008 | Chakravarthi et al. ........ 438/285 |
| 2008/0272410 A1 * | 11/2008 | Lin ................ 257/288 |

OTHER PUBLICATIONS

Non-Final Office Action for U.S. Appl. No. 11/748,376, Mailed Sep. 29, 2009, 18 Pages.
Office Action from U.S. Appl. No. 11/748,376 mailed Nov. 24, 2010, 9 pages.
Office Action from CN200880016059.2 mailed Aug. 24, 2010, 5 pages.
Office Action from Korean Patent Application 2009-7023583 mailed Apr. 28, 2011, 4 pages.
International Preliminary Report on Patentability from PCT/US2008/062597 mailed Nov. 26, 2009, 6 pgs.
Notice of Preliminary Rejection from Korean Patent Application No. 2009-7023583 mailed Apr. 28, 2011, 3 pgs.
Notice of Final Rejection from Korean Patent Application No. 2009-7023583 mailed Dec. 11, 2011, 2 pgs.
Notification of Reasons for Refusal from Japanese Patent Application No. 2010-507580 mailed Sep. 11, 2012, 5 pgs.
Decision of Refusal from Japanese Patent Application No. 2010-507580 mailed Feb. 5, 2013, 2 pgs.
Extended European Search Report from EP Application No. 08755045.5-2203 / 2149150 mailed Jan. 23, 2012, 9 pgs.
Final Office Action from U.S. Appl. No. 11/748,376 mailed Mar. 30, 2010, 11 pgs.
Final Office Action from U.S. Appl. No. 11/748,376 mailed Apr. 13, 2011, 11 pgs.
Final Office Action from U.S. Appl. No. 11/748,376 mailed May 23, 2012, 13 pgs.
Office Action from U.S. Appl. No. 11/748,376 mailed Dec. 21, 2011, 10 pgs.
Office Action for Korean Patent Application No. 201217003671, mailed Jul. 17, 2013, 2pgs.
Office Action and Search Report for Taiwan Patent Application No. 097116826, mailed May 9, 2013, 6 pgs.
Decision of Rejection for Taiwain Patent Application No. 097116826, mailed Nov. 28, 2013, 3 pgs.
Communication Pursuant to Article 34(3) for European Application No. 08755045.5 mailed May 22, 2013, 15 pgs.

* cited by examiner

SEMICONDUCTOR DEVICE HAVING TIPLESS EPITAXIAL SOURCE/DRAIN REGIONS

CROSS-REFERENCE TO RELATED APPLICATIONS

This application is a divisional of U.S. patent application Ser. No. 11/748,376, filed May 14, 2007, the entire contents of which are hereby incorporated by reference herein.

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained channel regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained channel regions may greatly enhance the rate at which charge migrates in a channel when a semiconductor device is in an ON state.

FIGS. 1A-C illustrate cross-sectional views representing a typical process flow for forming strain-inducing source/drain regions in a PMOS-FET, in accordance with the prior art. Referring to FIG. 1A, a non-strained PMOS-FET 100 is first formed. Non-strained PMOS-FET 100 is comprised of a channel region 102. A gate dielectric layer 104 sits above channel region 102 and a gate electrode 106 sits above gate dielectric layer 104. Gate dielectric layer 104 and gate electrode 106 are isolated by gate isolation spacers 108. Tip extensions 110 and source/drain regions 112 are formed by implanting dopant atoms into substrate 114 and are formed, in part, to reduce the parasitic resistance of non-strained PMOS-FET 100. Thus, the source/drain regions 112 are initially formed from the same material as the channel region 102. Therefore, the lattice mismatch between the source/drain regions 112 and the channel region 102 is negligible, resulting in effectively no strain on the channel region 102.

Referring to FIG. 1B, portions of substrate 114, including source/drain regions 112, are removed by an etch process to form recessed regions 116 in substrate 114. Subsequently, strain-inducing source/drain regions 120 are formed by selectively growing an epitaxial film into recessed regions 116, as depicted in FIG. 1C. Strain-inducing source/drain regions 120 can be doped with charge-carrier atoms, e.g. boron in the case of a PMOS-FET, which may be carried out in situ or after epitaxial film growth, or both. In an example, substrate 114, and hence channel region 102, is comprised of crystalline silicon and the film grown to form strain-inducing source/drain regions 120 is comprised of epitaxial silicon/germanium. The lattice constant of the epitaxial silicon/germanium film is greater than that of crystalline silicon by a factor of ~1% (for 70% Si, 30% Ge) and so strain-inducing source/drain regions 120 are comprised of a material with a larger lattice constant than that of channel region 102. Therefore, a uniaxial compressive strain, depicted by the arrows in FIG. 1C, is rendered on channel region 102 in strained PMOS-FET 130, which can enhance hole mobility in the device.

One drawback to this approach is that gate isolation spacers 108 are required to inhibit undesirable material growth on gate electrode 106 during epitaxial film growth to form strain-inducing source/drain regions 120, e.g. to inhibit the growth of silicon/germanium on a polysilicon gate electrode. The location of the strain-inducing source/drain regions 120 relative to channel region 102 is therefore restricted by the width of gate isolation spacers 108. Thus, the parasitic resistance-reducing ability and the strain-inducing ability of strain-inducing source/drain regions 120 may be limited. Tip extensions 110 may be formed in substrate 114 to reduce the resistance of strained PMOS-FET 130. However, tip extensions 110 are formed from the same material as channel region 102. Therefore, the lattice mismatch between tip extensions 110 and the channel region 102 is negligible, resulting in effectively no additional strain on the channel region 102 from tip extensions 110.

Thus, a semiconductor device having tipless epitaxial source/drain regions and a method for its formation are described herein.

DETAILED DESCRIPTION

Figure 1A:
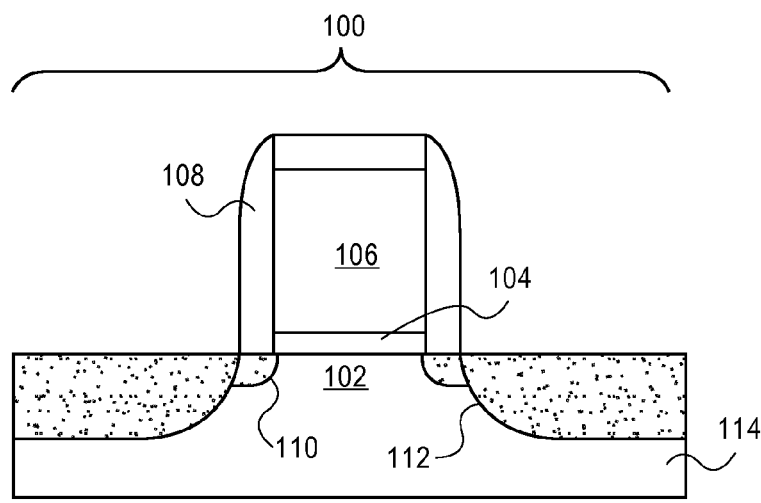
FIGS. 1A-C illustrate cross-sectional views representing a typical process flow for forming strain-inducing source/drain regions in a PMOS-FET, in accordance with the prior art.
Figure 1B:
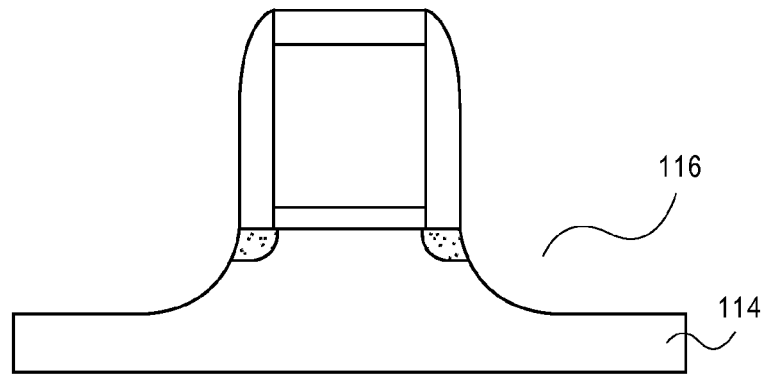
Figure 1C:
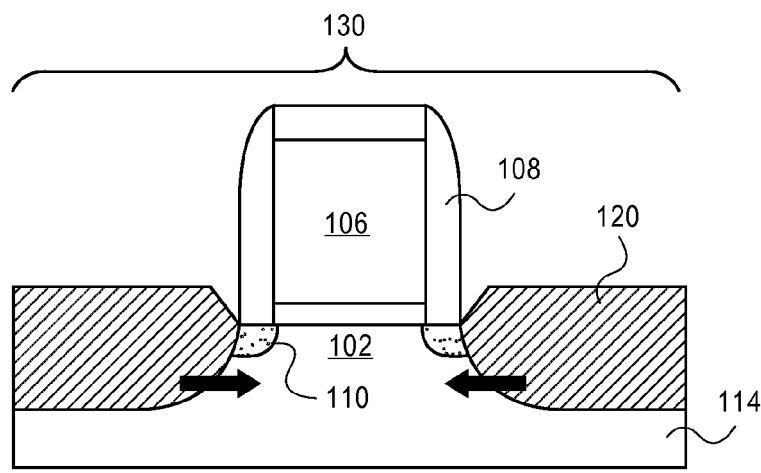

A semiconductor device having tipless epitaxial source/drain regions and a method for its formation are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps such as patterning steps or wet chemical cleans are not described in detail in order to not unnecessarily obscure the present invention. Furthermore, it is to be understood that the various embodiments shown in the Figures are illustrative representations and are not necessarily drawn to scale.

Disclosed herein are a semiconductor device having tipless epitaxial source/drain regions and a method to form such a device. In an embodiment, the semiconductor device comprises a gate stack on a substrate. The gate stack may be comprised of a gate electrode above a gate dielectric layer and may be above a channel region in the substrate. In one embodiment, the semiconductor device also comprises a pair of source/drain regions in the substrate on either side of the channel region. The pair of source/drain regions may be in direct contact with the gate dielectric layer and the lattice constant of the pair of source/drain regions may be different than the lattice constant of the channel region. In a specific embodiment, the semiconductor device is formed by using a dielectric gate stack placeholder.

A semiconductor device comprising tipless epitaxial source/drain regions may exhibit improved performance resulting from an increase in the strain-inducing ability of such source/drain regions. That is, the formation of strain-inducing source/drain regions in the absence of gate isolation spacers may enable the formation of strain-inducing source/drain regions directly adjacent to the gate stack and, hence, closer to the channel region directly underneath the gate stack. Thus, in accordance with an embodiment of the present invention, strain-inducing source/drain regions are formed in direct contact with the gate dielectric layer of a semiconductor device, optimizing the proximity of the strain-inducing source/drain regions to the channel region of the semiconductor device. In one embodiment, this structural arrangement provides for an increased mobility of charge-carriers in the channel region when the semiconductor device is in an ON state. In a specific embodiment, this structural arrangement eliminates the need for tip extensions because the parasitic resistance is mitigated by forming the strain-inducing source/drain regions proximate to the channel region.

The formation of strain-inducing source/drain regions directly adjacent to the gate stack may be carried out by using a dielectric gate stack placeholder in a replacement gate scheme. Thus in accordance with an embodiment of the present invention, material growth is inhibited on a dielectric gate stack placeholder, eliminating the need for gate isolation spacers during the fabrication of strain-inducing epitaxial source/drain regions. In one embodiment, the dielectric gate stack placeholder is subsequently replaced with an actual gate stack following the formation of strain-inducing epitaxial source/drain regions.

Figure 2:
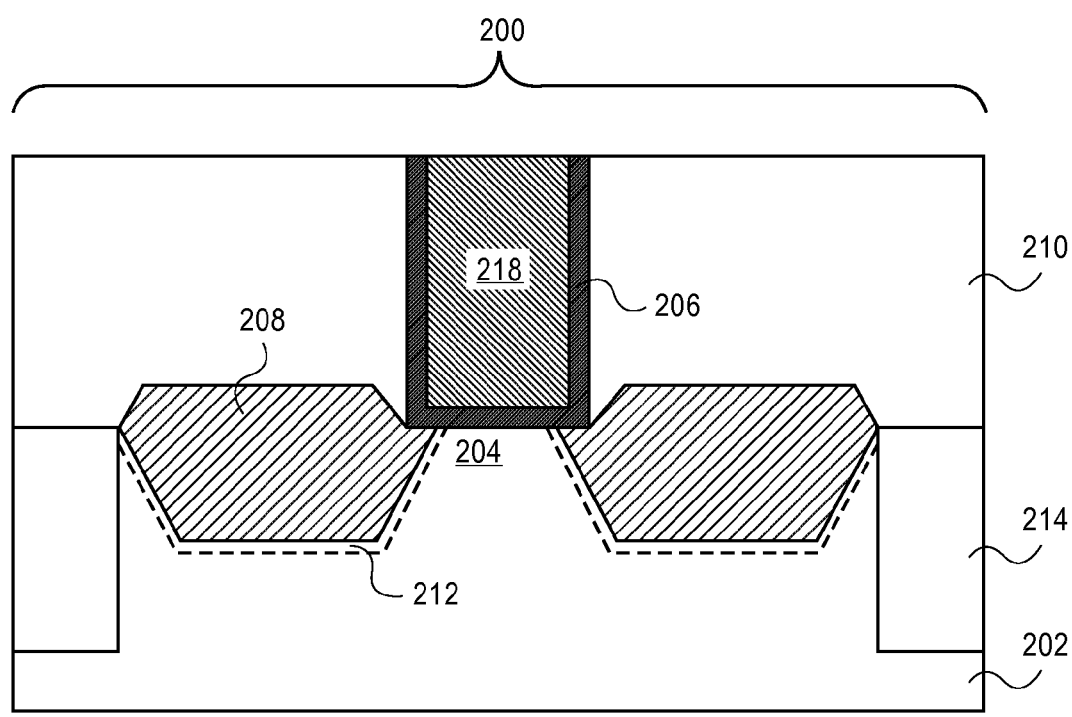
FIG. 2 illustrates a cross-sectional view representing a planar MOS-FET having tipless epitaxial source/drain regions, in accordance with an embodiment of the present invention.

A semiconductor device may be formed having epitaxial source/drain regions in direct contact with a gate stack. FIG. 2 illustrates a cross-sectional view representing a planar MOS-FET having tipless epitaxial source/drain regions, in accordance with an embodiment of the present invention.

Referring to FIG. 2, a semiconductor device 200 is comprised of a substrate 202 having a channel region 204. A gate stack comprised of a gate dielectric layer 206 and a gate electrode 218 sits above channel region 204. Strain-inducing epitaxial source/drain regions 208 are formed in substrate 202 on either side of and undercutting channel region 204. Strain-inducing epitaxial source/drain regions 208 are in direct contact with the gate stack and, in particular, with gate dielectric layer 204. An inter-layer dielectric film 210 is formed above strain-inducing epitaxial source/drain regions 208 and directly adjacent to the sidewalls of gate the gate stack.

Semiconductor device 200 may be any semiconductor device incorporating a gate, a channel region and a pair of source/drain regions. In accordance with an embodiment of the present invention, semiconductor device 200 is selected from the group consisting of a planar MOS-FET, a memory transistor or a Microelectromechanical System (MEMS). In one embodiment, semiconductor device 200 is a planar MOS-FET and is an isolated device or is one device in a plurality of nested devices. In a specific embodiment, semiconductor device 200 is a planar isolated PMOS-FET having isolation regions 214 on either side of strain-inducing epitaxial source/drain regions 208, as depicted in FIG. 2. As will be appreciated for the typical integrated circuit, both N- and P-channel transistors may be fabricated on a single substrate to form a CMOS integrated circuit.

Substrate 202 and, hence, channel region 204 may be comprised of any semiconductor material that can withstand a manufacturing process and in which charge can migrate. In an embodiment, substrate 202 is comprised of a crystalline silicon, silicon/germanium or germanium layer doped with a charge carrier, such as but not limited to phosphorus, arsenic, boron or a combination thereof. In one embodiment, the concentration of silicon atoms in substrate 202 is greater than 97%. In another embodiment, substrate 202 is comprised of an epitaxial layer grown atop a distinct crystalline substrate, e.g. a silicon epitaxial layer grown atop a boron-doped bulk silicon mono-crystalline substrate. Substrate 202 may also comprise an insulating layer in between a bulk crystal substrate and an epitaxial layer to form, for example, a silicon-on-insulator substrate. In an embodiment, the insulating layer is comprised of a material selected form the group consisting of silicon dioxide, silicon nitride, silicon oxy-nitride or a high-k dielectric layer. Substrate 202 may alternatively comprise a III-V material. In an embodiment, substrate 202 is comprised of a III-V material such as, but not limited to, gallium nitride, gallium phosphide, gallium arsenide, indium phosphide, indium antimonide, indium gallium arsenide, aluminum gallium arsenide, indium gallium phosphide or a combination thereof. Channel region 204 may be formed in a well of charge-carrier dopant impurity atoms. In one embodiment, substrate 202 is comprised of crystalline silicon and the charge-carrier dopant impurity atoms are selected from the group consisting of boron, arsenic, indium or phosphorus. In another embodiment, substrate 202 is comprised of a III-V material and the charge-carrier dopant impurity atoms are selected from the group consisting of carbon, silicon, germanium, oxygen, sulfur, selenium or tellurium.

The strain-inducing epitaxial source/drain regions 208 may be comprised of a low defect density mono-crystalline film having a lattice constant different than the lattice constant of substrate 202. The lattice constants are based on the atomic spacings and the unit cell orientations within each of the channel region 204 and the strain-inducing epitaxial source/drain regions 208. Thus, a pair of semiconductor regions formed within a crystalline substrate and having a lattice constant different than that of the crystalline substrate may impart a uniaxial strain to the portion of the crystalline substrate in between the pair of semiconductor regions. For example, in accordance with an embodiment of the present invention, the lattice constant of strain-inducing epitaxial source/drain regions 208 is larger than the lattice constant of channel region 204 and imparts a uniaxial compressive strain to the lattice of channel region 204. Thus, when the lattice constant of strain-inducing epitaxial source/drain regions 208 is larger than the lattice constant of channel region 204, the lattice-forming atoms of the strain-inducing epitaxial source/drain regions 208 are pushed together from their normal resting state and induce a compressive strain on channel region 204 as they attempt to relax. In a specific embodiment, this uniaxial compressive strain invoked on channel region 204 increases hole mobility in channel region 204. In an alternative embodiment of the present invention, the lattice constant of strain-inducing epitaxial source/drain regions 208 is smaller than the lattice constant of channel region 204 and imparts a uniaxial tensile strain to the lattice of channel region 204. Thus, when the lattice constant of strain-inducing epitaxial source/drain regions 208 is smaller than the lattice constant of channel region 204, the lattice-forming atoms of the strain-inducing epitaxial source/drain regions 208 are pulled apart from their normal resting state and induce a tensile strain on channel region 204 as they attempt to relax. In a specific embodiment, this uniaxial tensile strain invoked on channel region 204 increases electron mobility in channel region 204.

Strain-inducing epitaxial source/drain regions 208 may be comprised of any material having a lattice constant different than the lattice constant of channel region 204 and having a resistivity sufficiently low to mitigate parasitic resistance. In one embodiment, channel region 204 is comprised of $Si_xGe_{1-x}$ and strain-inducing epitaxial source/drain regions 208 are comprised of $Si_yGe_{1-y}$ where $0≤x, y≤1$ and $x≠y$. In a specific embodiment, semiconductor device 200 is a PMOS-FET, channel region 204 is comprised of silicon (i.e. x=1) and strain-inducing epitaxial source/drain regions 208 are comprised of silicon/germanium having an atomic ratio of 70:30 (i.e. y=0.7). In another embodiment, channel region 204 is comprised of silicon and strain-inducing epitaxial source/drain regions 208 are comprised of carbon-doped silicon. In a specific embodiment, semiconductor device 200 is an NMOS-FET, channel region 204 is comprised of silicon and strain-inducing epitaxial source/drain regions 208 are comprised of carbon-doped silicon having an atomic concentration of substitutional carbon atoms in the range of 0.5-1.5%. In an alternative embodiment, channel region 204 is comprised of a III-V material selected from the group consisting of $Al_xGa_{1-x}As$, $In_xGa_{1-x}As$, $In_xGa_{1-x}P$ or $Al_xIn_{1-x}Sb$ and strain-inducing epitaxial source/drain regions 208 are comprised of $Al_yGa_{1-y}As$, $In_yGa_{1-y}As$, $In_yGa_{1-y}P$ or $Al_yIn_{1-y}Sb$, respectively, where $0≤x, y≤1$ and $x≠y$. In a particular embodiment, source/drain regions 208 are comprised of a material having a lattice constant different than the lattice constant of channel region 204 by a factor of at least 0.1%.

Strain-inducing epitaxial source/drain regions 208 may further comprise charge-carrier dopant impurity atoms. In one embodiment, strain-inducing epitaxial source/drain regions 208 are comprised of epitaxial silicon/germanium and the charge-carrier dopant impurity atoms are boron atoms. In a specific embodiment, semiconductor device 200 is a PMOS-FET, channel region 204 is comprised of silicon and strain-inducing epitaxial source/drain regions 208 are comprised of silicon/germanium having a germanium atomic concentration in the range of 20-35% with a concentration of boron dopant impurity atoms in the range of $5×10^{19}$-$5×10^{20}$ atoms/cm$^3$. In another embodiment, strain-inducing epitaxial source/drain regions 208 are comprised of a III-V material and the charge-carrier dopant impurity atoms are selected from the group consisting of carbon, silicon, germanium, oxygen, sulfur, selenium or tellurium. Regions of out-diffusion 212 from strain-inducing epitaxial source/drain regions 208 and in substrate 202 may be formed adjacent to the periphery of strain-inducing epitaxial source/drain regions 208, as depicted in FIG. 2. In one embodiment, strain-inducing epitaxial source/drain regions 208 are comprised of boron-doped silicon/germanium and the regions of out-diffusion 212 are comprised of boron atoms. In a particular embodiment, the concentration of boron atoms in regions of out-diffusion 212 is in the range of $1×10^{17}$-$5×10^{20}$ atoms/cm$^3$.

The gate stack comprised of gate dielectric layer 206 and gate electrode 218 above channel region 204 and in direct contact with strain-inducing epitaxial source/drain regions 208 may be any stack of materials having a conductive region with a dielectric layer between the channel region 204 and the gate stack. In one embodiment, the gate dielectric layer is formed only between the gate electrode 218 and channel region 204. In another embodiment, the gate dielectric layer 206 extends along the sidewalls of gate electrode 218 and directly adjacent to inter-layer dielectric film 210, as depicted in FIG. 2.

Gate dielectric layer 206 may comprise any dielectric material suitable to insulate a conductive region 218 from channel region 204. For example, in accordance with an embodiment of the present invention, gate dielectric layer 206 is comprised of a high-k dielectric layer. In one embodiment, the high-k dielectric layer is selected from the group consisting of hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof. Furthermore, a portion of gate dielectric layer 206 may comprise a layer of native oxide formed from the top few layers of substrate 202. In an embodiment, gate dielectric layer 206 is comprised of a top high-k portion and a lower portion comprised of an oxide of a semiconductor material. In one embodiment, gate dielectric layer 206 is comprised of a top portion of hafnium oxide and a bottom portion of silicon dioxide or silicon oxy-nitride. In an alternative embodiment, gate dielectric layer 206 is comprised substantially of an oxide layer of the semiconductor material of substrate 202. In a specific embodiment, substrate 202 is comprised substantially of silicon and gate dielectric layer 206 is comprised substantially of silicon dioxide or silicon oxy-nitride.

Gate electrode 218 may be comprised of any conductive material having a suitable workfunction. In an embodiment, gate electrode 218 is a metal gate electrode. In one embodiment, gate electrode 218 is comprised of a metal-containing layer selected from the group consisting of metal nitrides, metal carbides, metal silicides, metal aluminides, hafnium, zirconium, titanium, tantalum, aluminum, ruthenium, palladium, platinum, cobalt, nickel or conductive metal oxides, e.g. ruthenium oxide. In a specific embodiment, gate electrode 218 is comprised of a non-workfunction-setting fill material formed above a metal workfunction-setting layer. In an alternative embodiment, gate electrode 218 is comprised of doped polycrystalline silicon.

Inter-layer dielectric film 210 covers strain-inducing epitaxial source/drain regions 208 and is directly adjacent to the sidewalls of the gate stack. Inter-layer dielectric film 210 may be comprised of any material suitable withstand the fabrication of a plurality of interconnects above semiconductor device 200 while maintaining a sufficient electrical isolation between semiconductor device 200 and any neighboring semiconductor devices. In one embodiment, inter-layer dielectric film 210 is comprised of silicon dioxide or silicon oxy-nitride. In another embodiment, inter-layer dielectric film 210 is comprised of a low-k dielectric material. In a specific embodiment, inter-layer dielectric film 210 is comprised of carbon-doped silicon oxide having a dielectric constant in the range of 2.5-4.

Tipless strain-inducing epitaxial source/drain regions may be incorporated into a semiconductor device by using a dielectric gate stack placeholder in a replacement gate integration scheme. FIGS. 3A-J illustrate cross-sectional views representing the formation of a planar MOS-FET having tipless epitaxial source/drain regions, in accordance with an embodiment of the present invention.

Figure 3A:
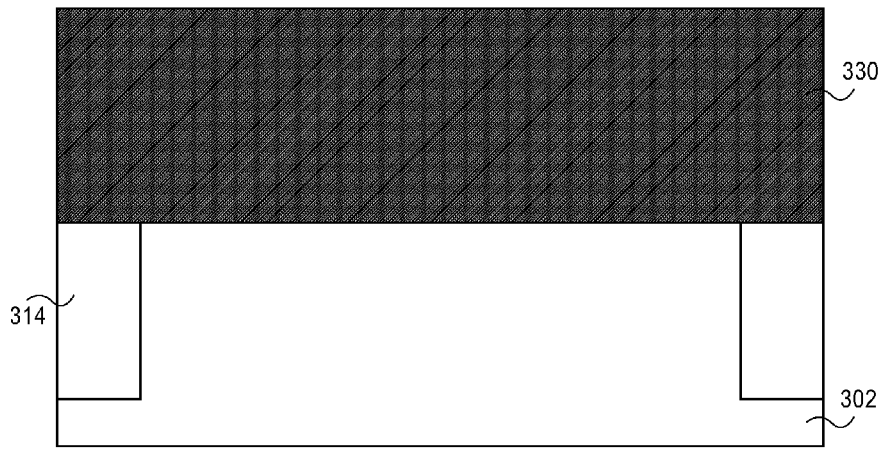
FIGS. 3A-J illustrate cross-sectional views representing the formation of a planar MOS-FET having tipless epitaxial source/drain regions, in accordance with an embodiment of the present invention.

Referring to FIG. 3A, a pre-patterned dielectric gate stack placeholder layer 330 is formed above a substrate 302. Substrate 302 may be any substrate described in association with substrate 202 from FIG. 2. In accordance with an embodiment of the present invention, isolation regions 314 are incorporated into substrate 302, as depicted in FIG. 3A. In a specific embodiment, isolation regions 314 are comprised substantially of silicon dioxide and are fabricated by a shallow-trench isolation (STI) integration scheme.

Pre-patterned dielectric gate stack placeholder layer 330 may be comprised of any dielectric material suitable to be patterned selective to substrate 302 and isolation regions 314 and suitable to inhibit growth of a semiconductor material during a subsequent epitaxial deposition process. In one embodiment, pre-patterned dielectric gate stack placeholder layer 330 is comprised of a material selected from the group consisting of silicon dioxide, silicon oxy-nitride and silicon nitride. In a specific embodiment, substrate 302 is comprised substantially of silicon, isolation regions 314 are comprised of silicon dioxide and pre-patterned dielectric gate stack placeholder layer 330 is comprised substantially of silicon nitride. A protecting layer may be incorporated between pre-patterned dielectric gate stack placeholder layer 330 and substrate 302. In one embodiment, a native layer of silicon dioxide is formed between pre-patterned dielectric gate stack placeholder layer 330 and substrate 302. However, in an alternative embodiment, pre-patterned dielectric gate stack placeholder layer 330 is formed directly on the top surface of substrate 302, as depicted in FIG. 3A. Thus, in one embodiment, a distinct gate dielectric placeholder is not required in a replacement gate integration scheme.

Pre-patterned dielectric gate stack placeholder layer 330 may be deposited by any technique suitable to provide a reliable (i.e. uniform composition and thickness) dielectric layer above the top surface of substrate 302. In accordance with an embodiment of the present invention, pre-patterned dielectric gate stack placeholder layer 330 is formed by a chemical vapor deposition (CVD) process. In one embodiment, pre-patterned dielectric gate stack placeholder layer 330 is comprised of stoichiometric silicon nitride ($Si_3N_4$) and is deposited by a CVD process utilizing the precursors $SiH_4$ and $NH_3$ at a temperature in the range of 500-850 degrees Celsius. Pre-patterned dielectric gate stack placeholder layer 330 may be deposited to any thickness suitable to define the height of a subsequently formed gate stack. In accordance with an embodiment of the present invention, pre-patterned dielectric gate stack placeholder layer 330 is deposited to a thickness in the range of 50-200 nanometers.

Figure 3B:
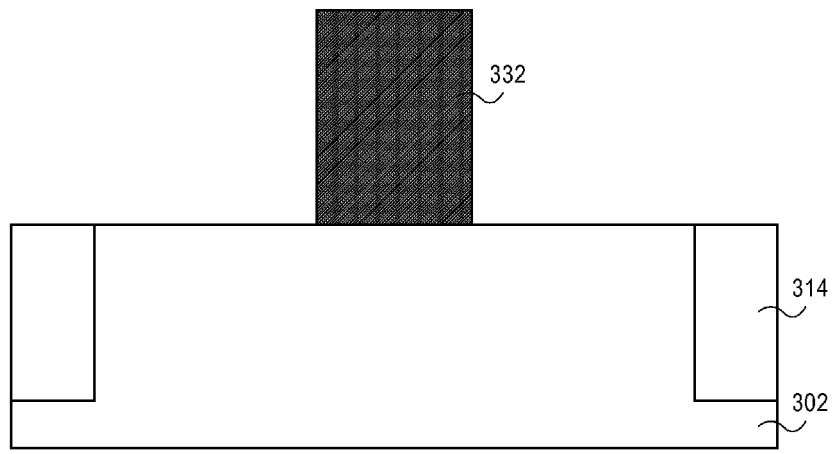

Referring to FIG. 3B, pre-patterned dielectric gate stack placeholder layer 330 is patterned to form dielectric gate stack placeholder 332 without substantially impacting substrate 302 or isolation regions 314. In accordance with an embodiment of the present invention, a lithography/etch process is used to provide dielectric gate stack placeholder 332. For example, in one embodiment, pre-patterned dielectric gate stack placeholder layer 330 is patterned by first patterning a positive photo-resist layer above pre-patterned dielectric gate stack placeholder layer 330 upon exposure to a wavelength of light selected from the group consisting of 248 nm, 193 nm and 157 nm. In another embodiment, an e-beam direct-write process is used to pattern the positive photo-resist layer. An etch process may then be used to pattern pre-patterned dielectric gate stack placeholder layer 330. In one embodiment, a dry etch process is used. In a particular embodiment, pre-patterned dielectric gate stack placeholder layer 330 is comprised substantially of silicon and the dry etch process comprises an anisotropic plasma etch process wherein the plasma is generated from gases selected from the group consisting of HBr and $Cl_2$. In one embodiment, a hardmask layer is utilized in between the positive photo-resist and pre-patterned dielectric gate stack placeholder layer 330. Dielectric gate stack placeholder 332 may be patterned to any width suitable to provide a channel region having a desired channel length in substrate 302. That is, the width of dielectric gate stack placeholder 332 may subsequently determine the width of a gate stack above substrate 302. In one embodiment, the width of dielectric gate stack placeholder 332 is the width of the critical dimension of the lithographic process used to pattern pre-patterned dielectric gate stack placeholder layer 330. In another embodiment, the width of dielectric gate stack placeholder 332 is in the range of 5-500 nanometers. In a specific embodiment, the width of dielectric gate stack placeholder 332 is in the range of 10-100 nanometers.

Figure 3C:
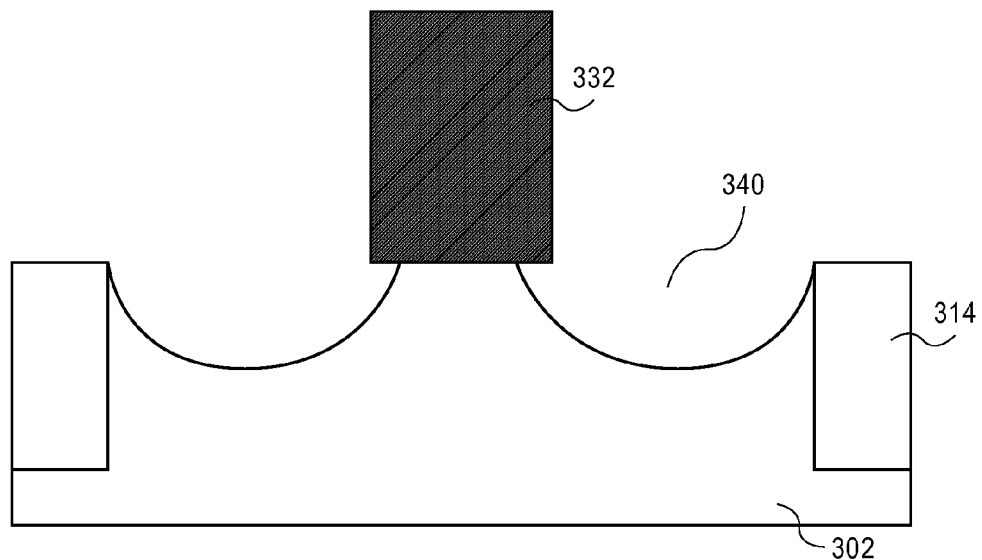
Figure 3C:
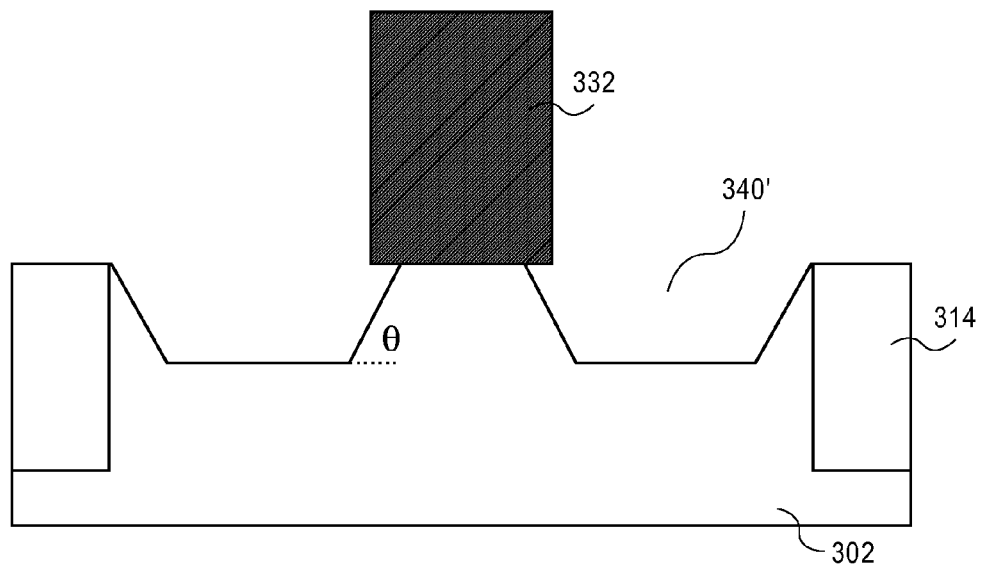

Referring to FIGS. 3C and 3C', etched-out regions 340 and 340' may be formed in substrate 302 selective to dielectric gate stack placeholder 332 and isolation regions 314. Etched-out regions 340 and 340' may be formed by any technique suitable to selectively remove a portion of substrate 302 and to undercut dielectric gate stack placeholder 332. In one embodiment, etched-out regions 340 and 340' are formed by etching any exposed portions of substrate 302 with a dry etch process, a wet etch process or a combination thereof. In one embodiment, etched-out regions 340 are formed by a dry plasma etch using a plasma generated from a gas selected from the group consisting of $NF_3$ or $SF_6$ to form isotropic etched-out regions 340, as depicted in FIG. 3C. In an alternative embodiment, etched-out regions 340' are formed by a wet etch using $NH_4OH$ or tetramethylammonium hydroxide. The wet etch may be anisotropic in that the etch rate is significantly slow in directions of high crystal density. For example, in a specific embodiment, the wet etch is hindered by <111> crystal planes in a (100) silicon substrate to provide etched-out regions 340' having an undercut profile θ of approximately 55 degrees, as depicted in FIG. 3C'. The extent of undercut underneath dielectric gate stack placeholder 332 may be increased by first carrying out a brief dry etch followed by an anisotropic wet etch process. Etched-out regions 340 and 340' may have any depth suitable for subsequently defining the depth of an epitaxially grown strain-inducing source/drain region. In one embodiment, the depth of etched-out regions 340 and 340' is in the range of 50-150 nanometers. Etched-out regions 340 and 340' may undercut dielectric gate stack placeholder 332 by any amount suitable to optimize the performance of a subsequently formed semiconductor device. In one embodiment, etched-out regions 340 and 340' undercut dielectric gate stack placeholder 332 by an amount in the range of 2-20% of the cross-section width of dielectric gate stack placeholder 332 on either side of dielectric gate stack placeholder 332.

Figure 3D:
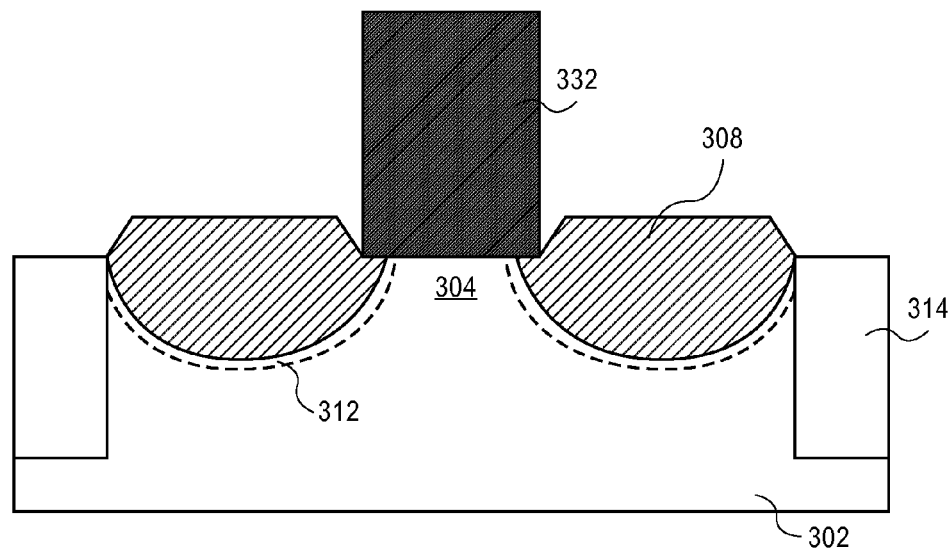
Figure 3D:
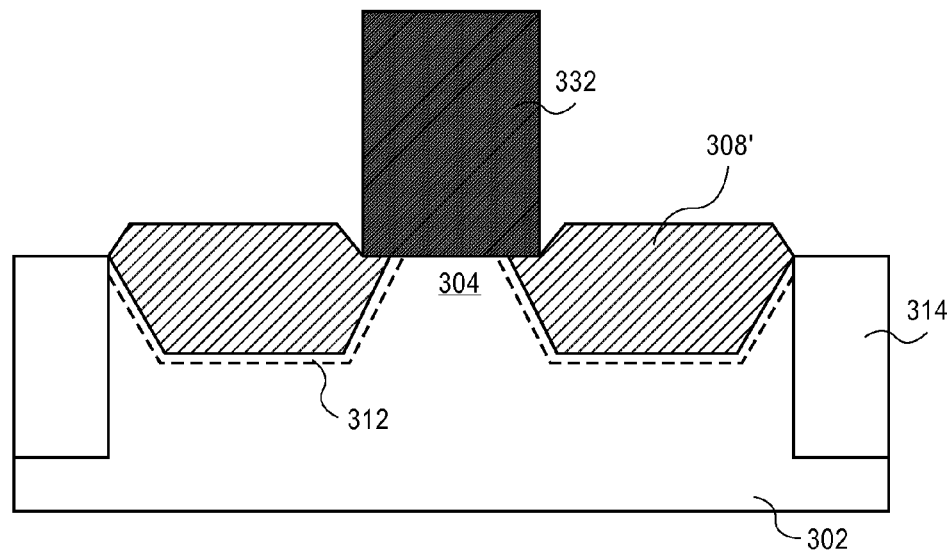

Referring to FIGS. 3D and 3D', strain-inducing epitaxial source/drain regions 308 and 308' are formed in etched-out regions 340 and 340', respectively, and a channel region 304 is thus defined in substrate 302. Strain-inducing epitaxial source/drain regions 308 and 308' may be comprised of any material described in association with strain-inducing epitaxial source/drain regions 208 from FIG. 2. Additionally, in accordance with an embodiment of the present invention, strain-inducing epitaxial source/drain regions 308 and 308' have a lattice constant different from the lattice constant channel region 304. Thus, in one embodiment, a uniaxial strain is imparted to channel region 304. In a particular embodiment, the top surfaces of strain-inducing epitaxial source/drain regions 308 and 308' are raised above the top surface of channel region 304, as depicted in FIGS. 3D and 3D'.

Strain-inducing epitaxial source/drain regions 308 and 308' may be formed by any technique suitable to form a highly uniform and low defect epitaxial layer. Particularly, strain-inducing epitaxial source/drain regions 308 and 308' may be formed by a process that does not leave material deposited on polar dielectric surfaces, such as on the surface of isolation regions 314 or dielectric gate stack placeholder 332. Thus, in accordance with an embodiment of the present invention, a totally selective deposition process is used to form strain-inducing epitaxial source/drain regions 308 and 308' in substrate 302. In an embodiment, strain-inducing epitaxial source/drain regions 308 and 308' are deposited by a process selected from the group consisting of chemical vapor epitaxy, molecular-beam epitaxy or laser-abolition epitaxy. In one embodiment, strain-inducing epitaxial source/drain regions 308 and 308' are comprised of silicon/germanium and are deposited using the precursors $SiH_4$ and $GeH_4$. A wet chemical clean may be carried out immediately prior to the deposition of strain-inducing epitaxial source/drain regions 308 and 308'. In one embodiment, the wet chemical cleaning process step comprises the application of an aqueous solution of hydrofluoric acid, ammonium fluoride or both to a silicon substrate 302. In a particular embodiment of the present invention, upon deposition of strain-inducing epitaxial source/drain regions 308 and 308', regions of out-diffusion 312 may be formed adjacent to the periphery of strain-inducing epitaxial source/drain regions 308, as depicted in FIGS. 3D and 3D'. In one embodiment, the regions of out-diffusion 312 are a consequence of the deposition temperature used to form strain-inducing epitaxial source/drain regions 308 and 308'. For convenience, the structure of FIG. 3D' having strain-inducing epitaxial source/drain regions 308' is illustrated throughout remaining FIGS. 3E-J.

Figure 3E:
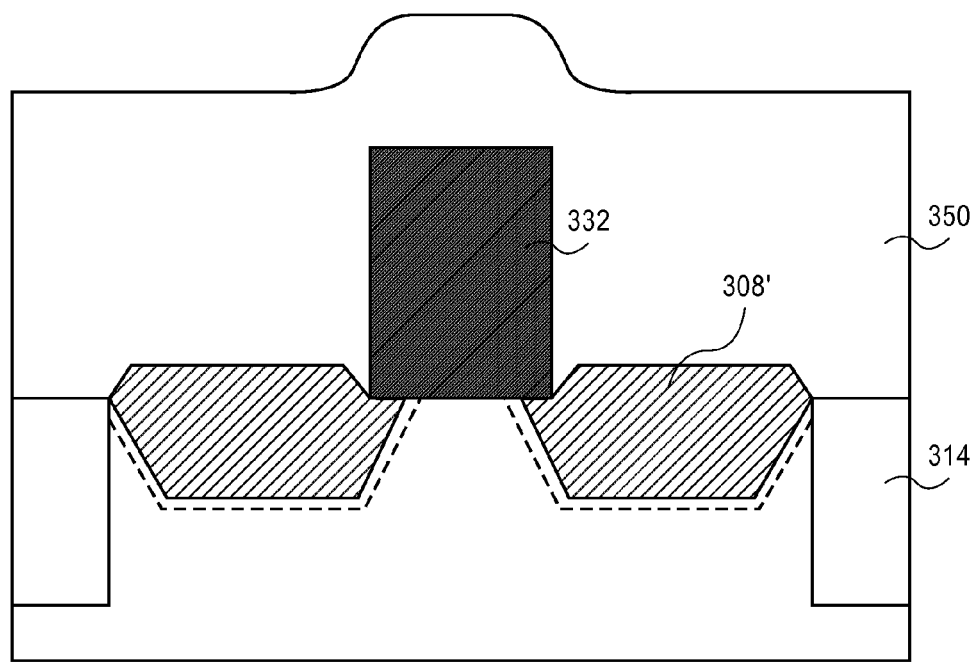

Referring to FIG. 3E, a blanket dielectric film 350 is deposited above isolation regions 314, strain-inducing epitaxial source/drain regions 308' and dielectric gate stack placeholder 332. Blanket dielectric film 350 may be comprised of any material described in association with inter-layer dielectric film 210 from FIG. 2. Blanket dielectric film 350 may be deposited by any technique suitable to provide a substantially conformal film over isolation regions 314, strain-inducing epitaxial source/drain regions 308' and dielectric gate stack placeholder 332. In one embodiment, blanket dielectric film 350 is deposited by technique selected from the group consisting of a CVD process and a spin-on coating process. Blanket dielectric film 350 may be deposited to any thickness suitable to entirely cover isolation regions 314, strain-inducing epitaxial source/drain regions 308' and dielectric gate stack placeholder 332. In one embodiment, blanket dielectric film 350 is deposited to a thickness in the range of 250-400 nanometers.

Figure 3F:
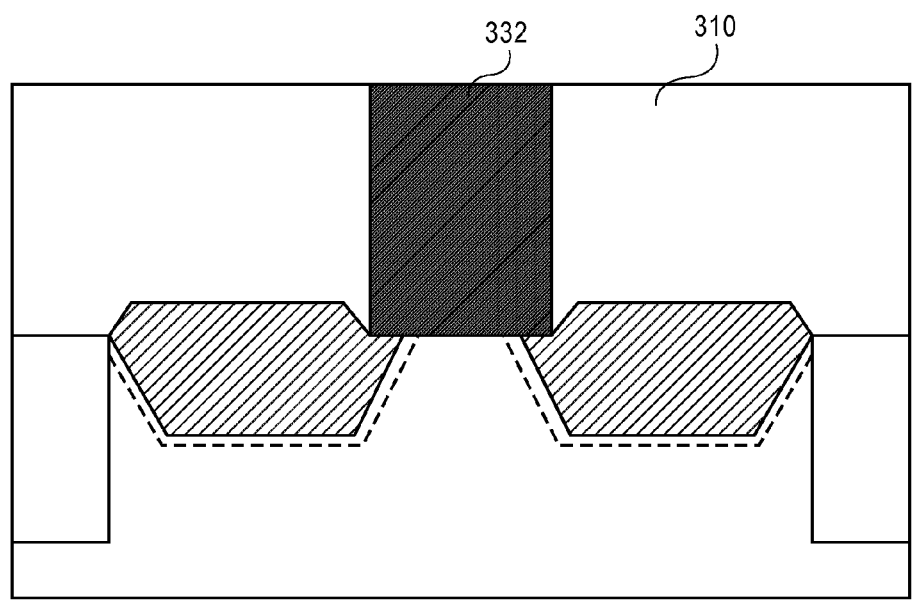

Referring to FIG. 3F, blanket dielectric film 350 is planarized to form inter-layer dielectric film 310 and to expose the top surface of dielectric gate stack placeholder 332. Blanket dielectric film may be planarized by any technique suitable to provide a substantially flat surface for inter-layer dielectric film 310 without dishing below the top surface of dielectric gate stack placeholder 332. In one embodiment, a timed planarization step is utilized. In another embodiment, a chemical-mechanical polish step is used to planarize blanket dielectric film 350 and the top surface of dielectric gate stack placeholder 332 acts as a natural polish-stop indicator.

Figure 3G:
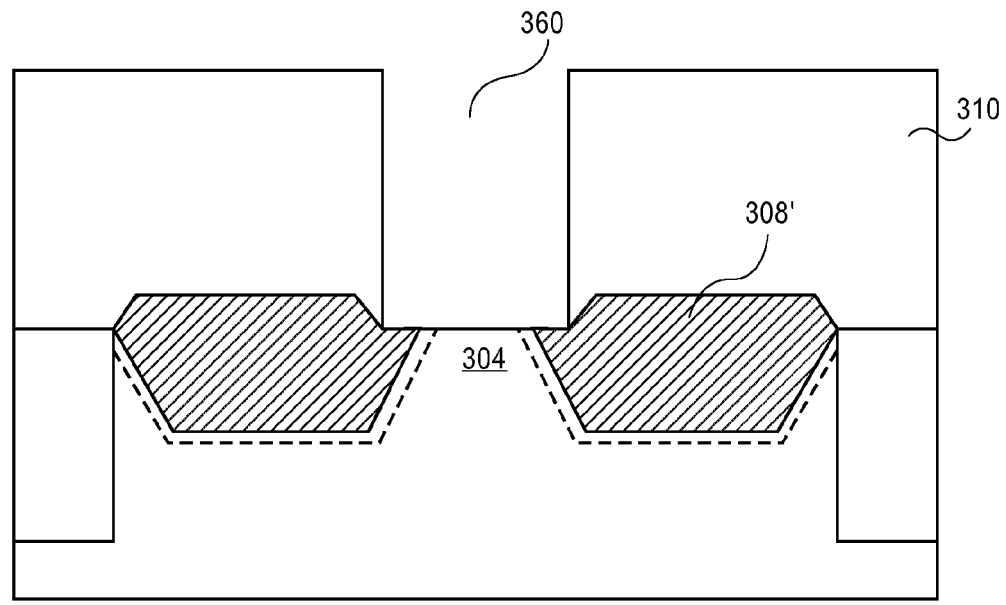

Referring to FIG. 3G, dielectric gate stack placeholder 332 is removed to provide trench 360 in inter-layer dielectric film 310, above channel region 304 and directly adjacent to strain-inducing epitaxial source/drain regions 308'. Dielectric gate stack placeholder may be removed by any technique suitable to minimally impact the exposed surfaces of inter-layer dielectric film 310, channel region 304 and strain-inducing epitaxial source/drain regions 308'. In accordance with an embodiment of the present invention, dielectric gate stack placeholder 332 is removed by using a dry or a wet etch process step. In one embodiment, dielectric gate stack placeholder 332 is comprised substantially of silicon nitride, inter-layer dielectric film 310 is comprised of silicon dioxide, channel region 304 is comprised of silicon, strain-inducing epitaxial source/drain regions 308' are comprised of silicon/germanium and a dry etch process utilizing at least the gas HBr is used to remove dielectric gate stack placeholder 332. In another embodiment, dielectric gate stack placeholder 332 is removed by using a wet etch comprised of aqueous phosphoric acid having a temperature in the range of 130-165 degrees Celsius. In a specific embodiment, a thin layer of silicon dioxide is used between dielectric gate stack placeholder 332 and channel region 304 to act as an etch stop. The thin layer of silicon dioxide is subsequently removed by a quick wet etch step comprising ultra-dilute aqueous HF.

Figure 3H:
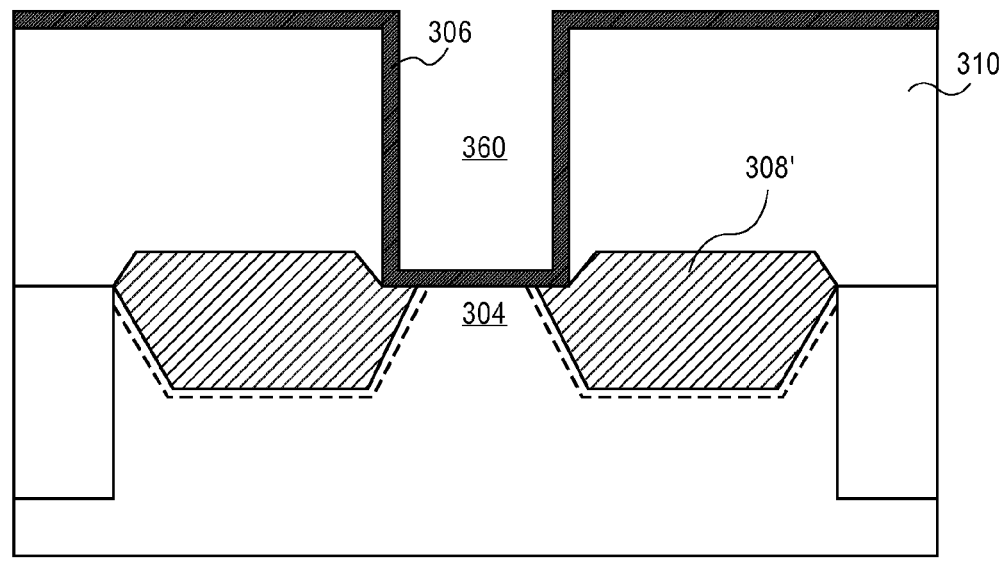

Referring to FIG. 3H, a gate dielectric layer 306 is deposited into trench 360 above channel region 304 and in direct contact with strain-inducing epitaxial source/drain regions 308'. Gate dielectric layer 306 may be comprised of any material or material combination described in association with gate dielectric layer 206 from FIG. 2. Gate dielectric layer 306 may be deposited by any technique that provides substantially conformal coverage of the exposed surface of channel region 304. Furthermore, gate dielectric layer 306 may be deposited by any technique that provides substantially conformal coverage of the sidewalls of inter-layer dielectric film 310, as depicted in FIG. 3H. In accordance with an embodiment of the present invention, gate dielectric layer 306 is deposited by a technique selected from the group consisting of atomic layer deposition, chemical vapor deposition and thermal consumption of the top surface of channel region 304. Gate dielectric layer may be deposited to any thickness suitable to form a high performance capacitor with channel region 304 and a subsequently formed gate electrode. In one embodiment, gate dielectric layer is comprised substantially of a high-k dielectric layer having a thickness in the range of 10-60 Angstroms. In a specific embodiment, gate dielectric layer is comprised substantially of a top layer of hafnium oxide having a thickness in the range of 5-40 Angstroms and a bottom layer of silicon dioxide having a thickness in the range of 3-6 Angstroms. In an alternative embodiment, a gate dielectric layer is formed between pre-patterned dielectric gate stack placeholder layer 330 and substrate 302 from FIG. 3A. The gate dielectric layer is subsequently patterned and carried through all of the process steps described in association with FIGS. 3B-G.

Figure 3I:
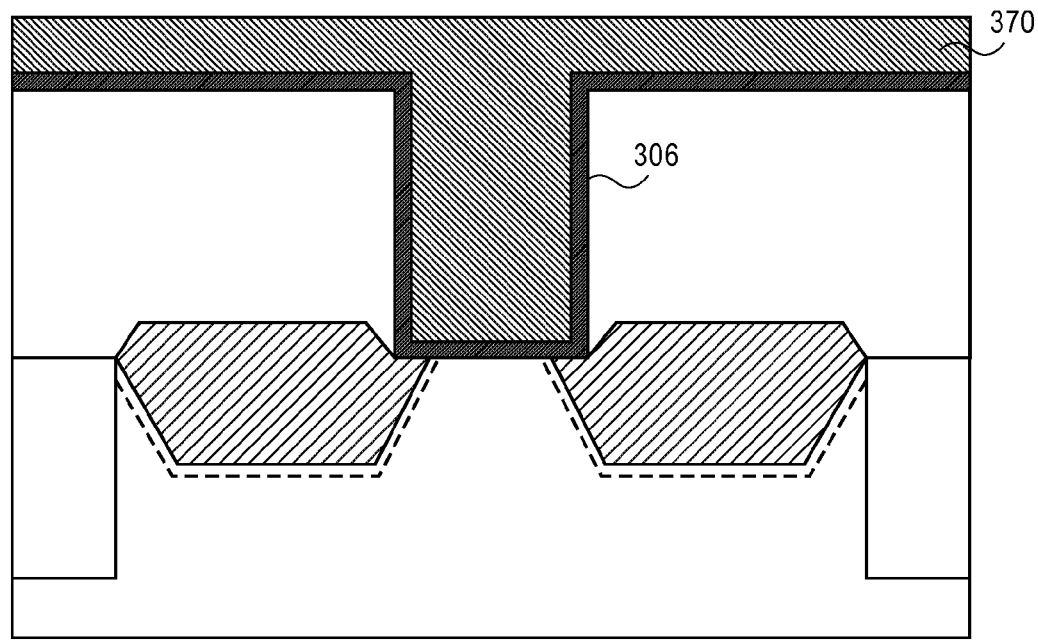

Referring to FIG. 3I, a conductive layer 370 is formed above the top surfaces of gate dielectric layer 306 and in trench 360. Conductive layer 370 may be comprised of any material described in association with gate electrode 218 from FIG. 2. In one embodiment, conductive layer 370 is comprised of a thin workfunction-settling portion below a bulk trench-fill portion. Conductive layer 370 may be deposited by any technique and that can substantially fill trench 360 with minimal risk of void formation. In one embodiment, conductive layer 370 is deposited by a technique selected from the group consisting of electro-deposition, electroless-plating, atomic vapor deposition, chemical vapor deposition and physical vapor deposition.

Figure 3J:
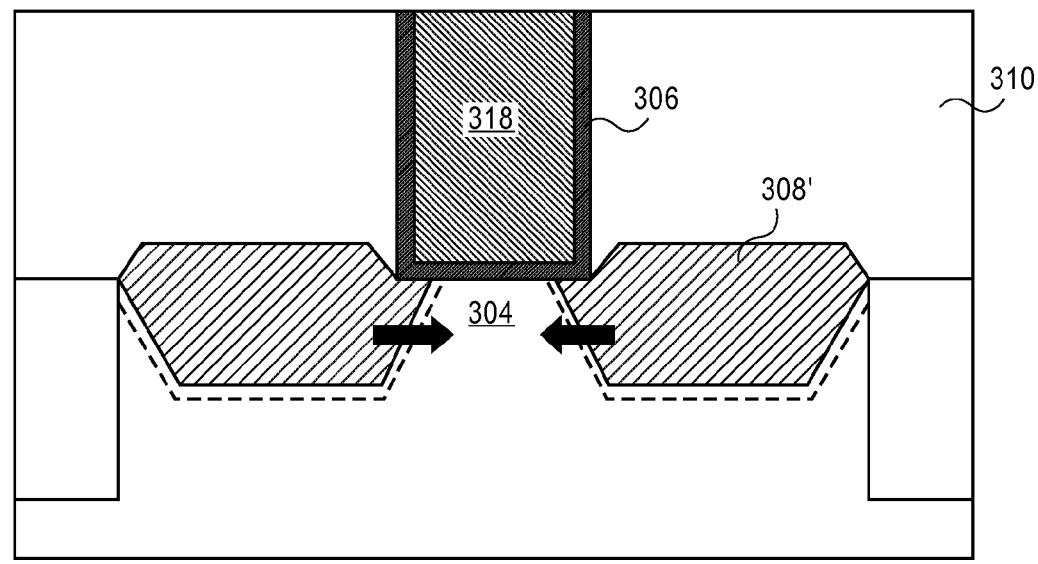

Referring to FIG. 3J, the portions of gate dielectric layer 306 and conductive layer 370 above inter-layer dielectric film 310 are removed to provide gate electrode 318. The portions of gate dielectric layer 306 and conductive layer 370 above inter-layer dielectric film 310 may be removed by any technique suitable to provide a substantially flat surface of inter-layer dielectric film 310. In one embodiment, the portions of gate dielectric layer 306 and conductive layer 370 above inter-layer dielectric film 310 are removed by a chemical-mechanical polish step.

Thus, tipless strain-inducing epitaxial source/drain regions may be incorporated into a semiconductor device by using a dielectric gate stack placeholder in a replacement gate integration scheme. In one embodiment, strain-inducing epitaxial source/drain regions 308' are comprised substantially of boron-doped silicon/germanium, channel region 304 is comprised substantially of silicon, and a compressive uniaxial strain is invoked on channel region 304, as depicted by the arrows in FIG. 3J. The structure described in association with FIG. 3J may then undergo typical process steps to complete the formation of a semiconductor device and to incorporate the device into an integrated circuit. For example, in accordance with an embodiment of the present invention, contact holes are subsequently formed in inter-layer dielectric film 310 and above strain-inducing epitaxial source/drain regions 308'. A through-contact silicidation step is then carried out prior to formation of back-end metal layers. In an alternative embodiment, a silicide layer is formed on strain-inducing epitaxial source/drain regions 308' prior to the deposition of blanket dielectric film 350 from FIG. 3E.

The present invention is not limited to planar semiconductor devices. FIGS. 4A-G illustrate cross-sectional views representing the formation of a trigate MOS-FET having tipless epitaxial source/drain regions, in accordance with an embodiment of the present invention.

Figure 4A:
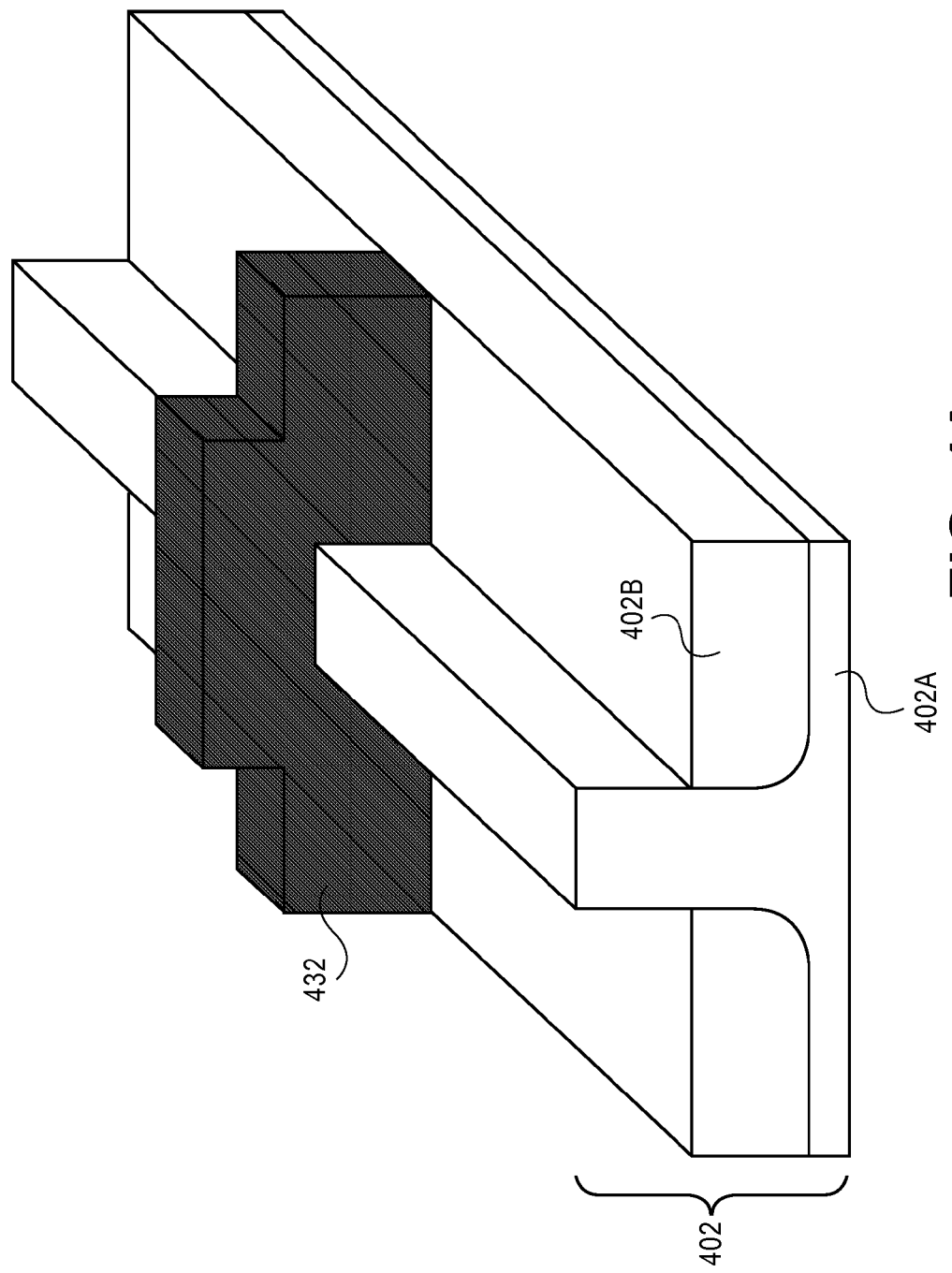
FIGS. 4A-G illustrate cross-sectional views representing the formation of a trigate MOS-FET having tipless epitaxial source/drain regions, in accordance with an embodiment of the present invention.
Figure 4B:
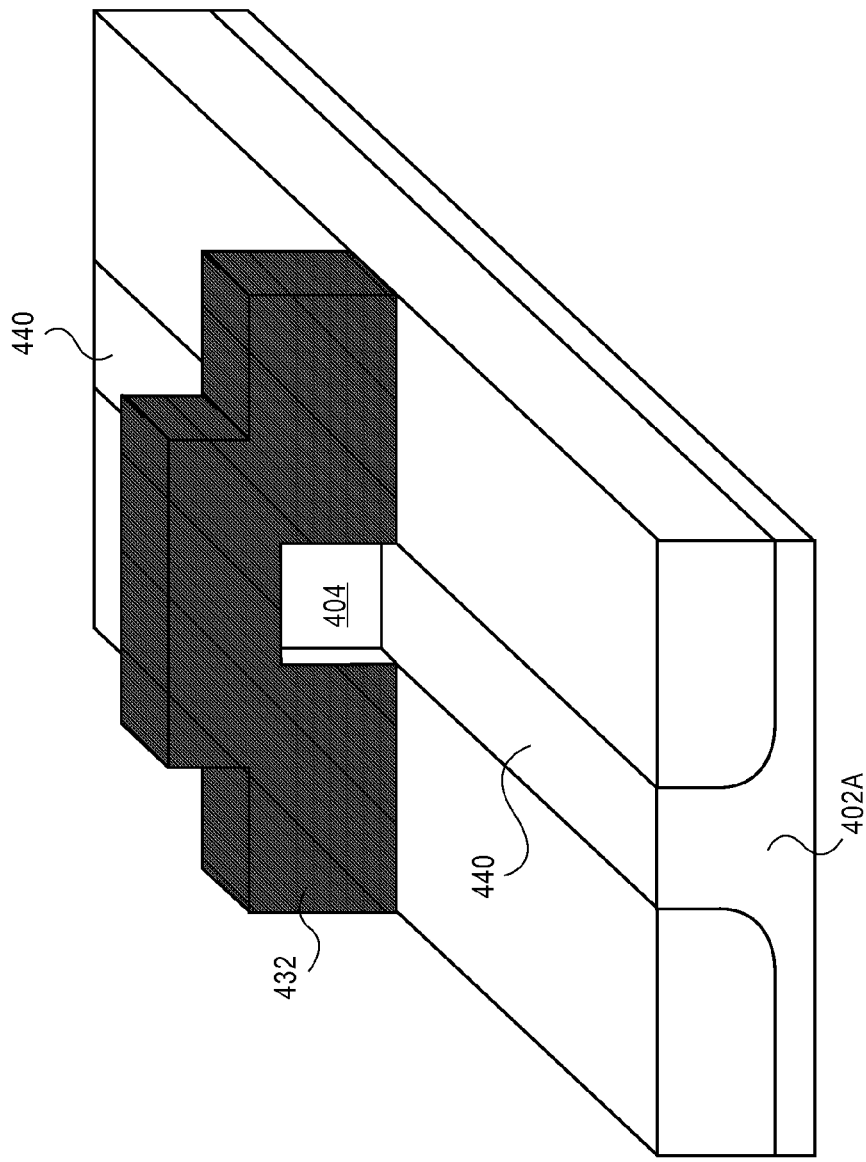
Figure 4C:
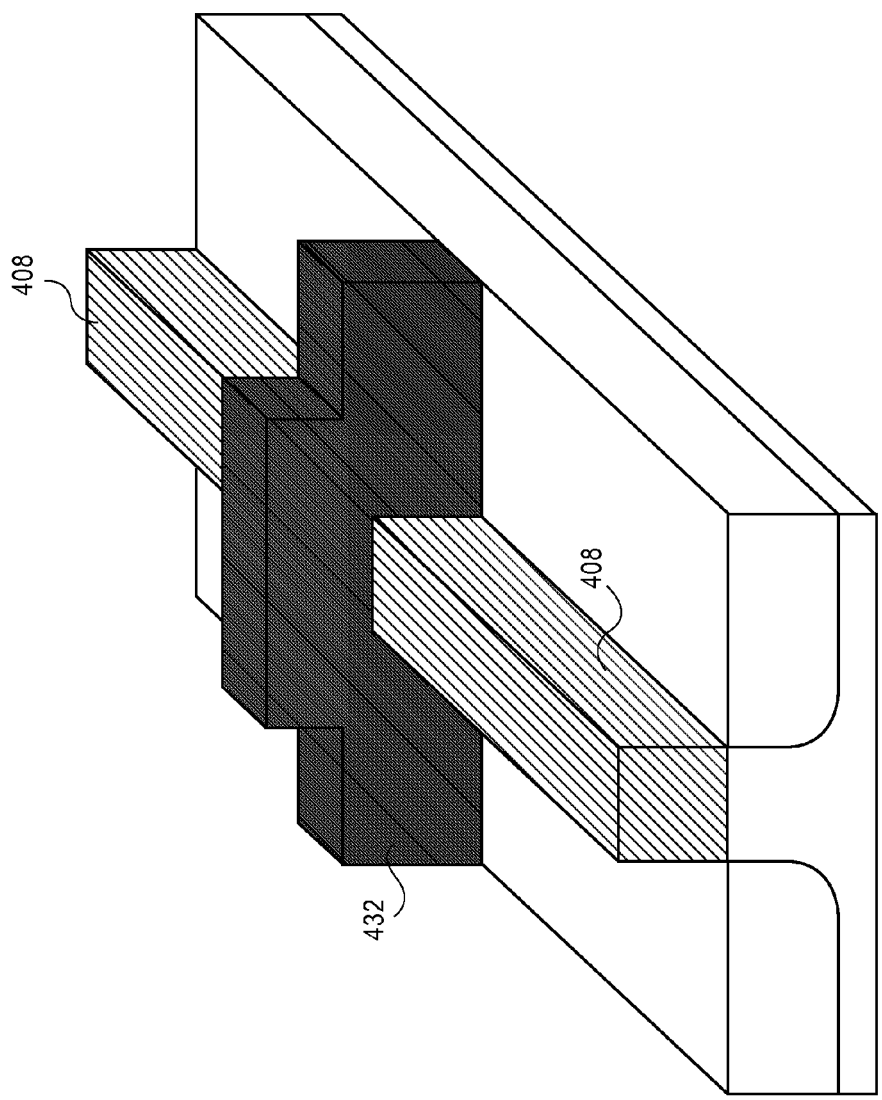
Figure 4D:
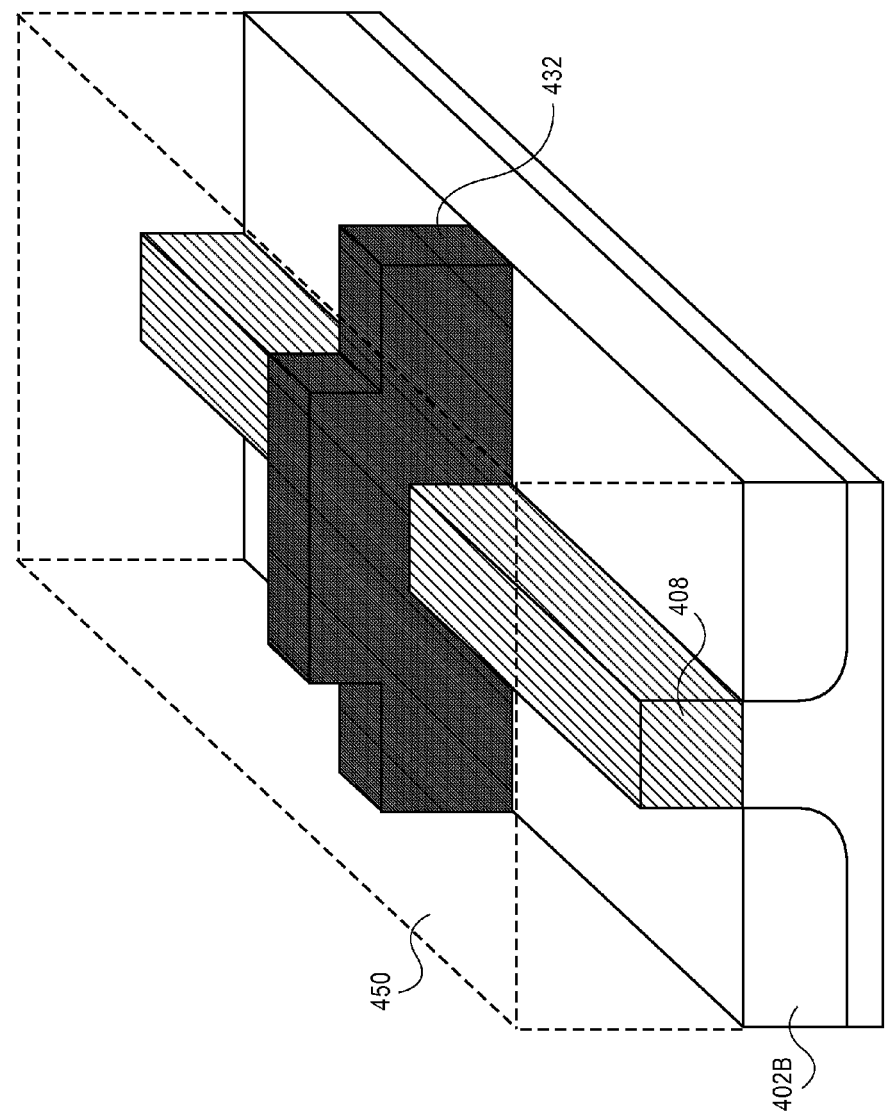
Figure 4E:
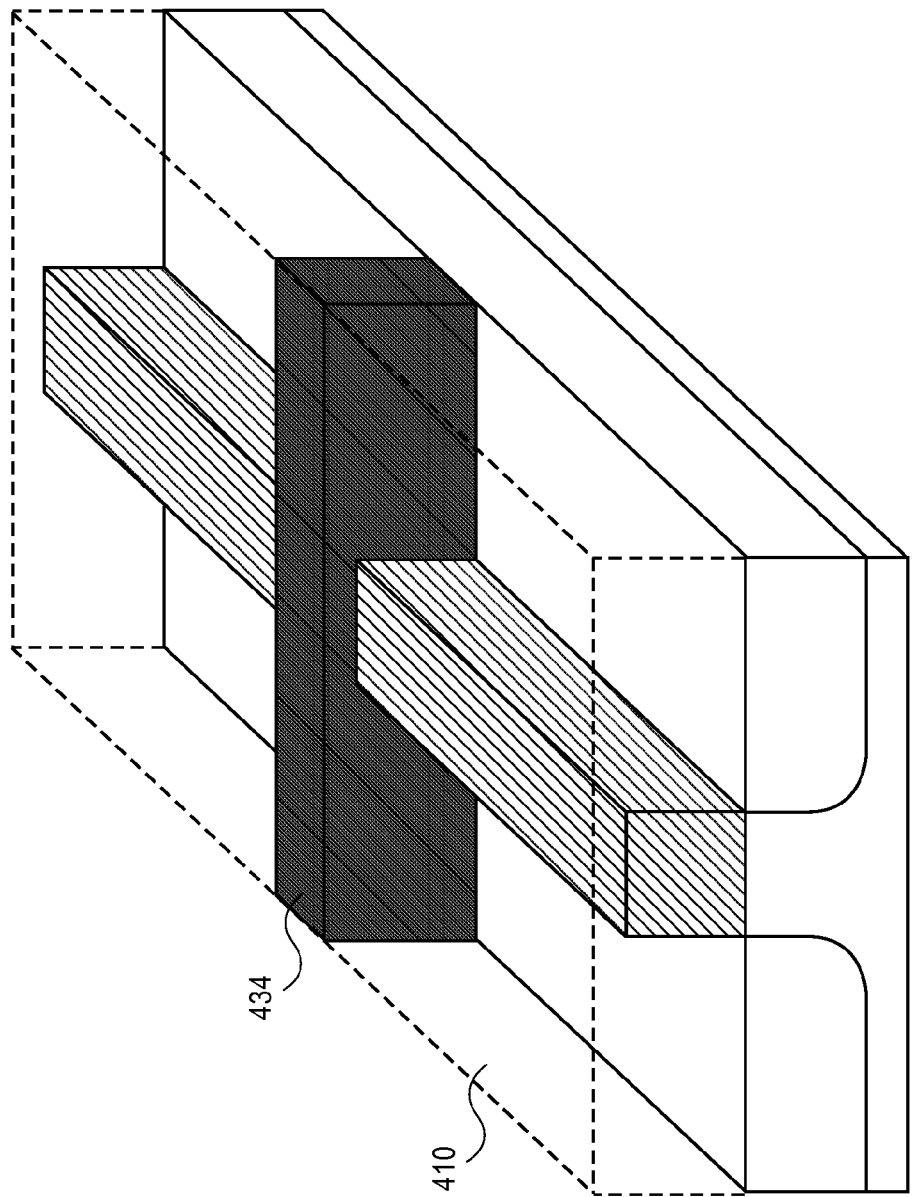
Figure 4F:
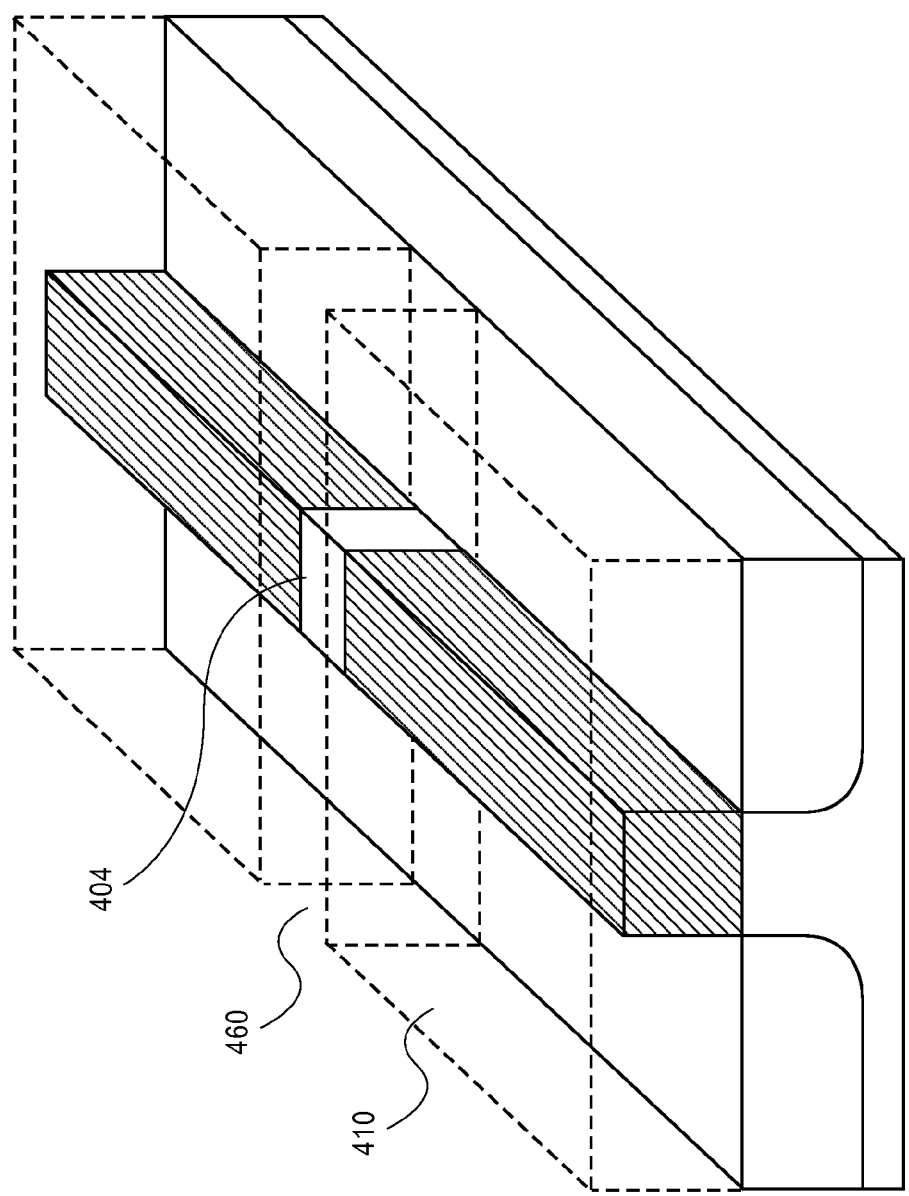
Figure 4G:
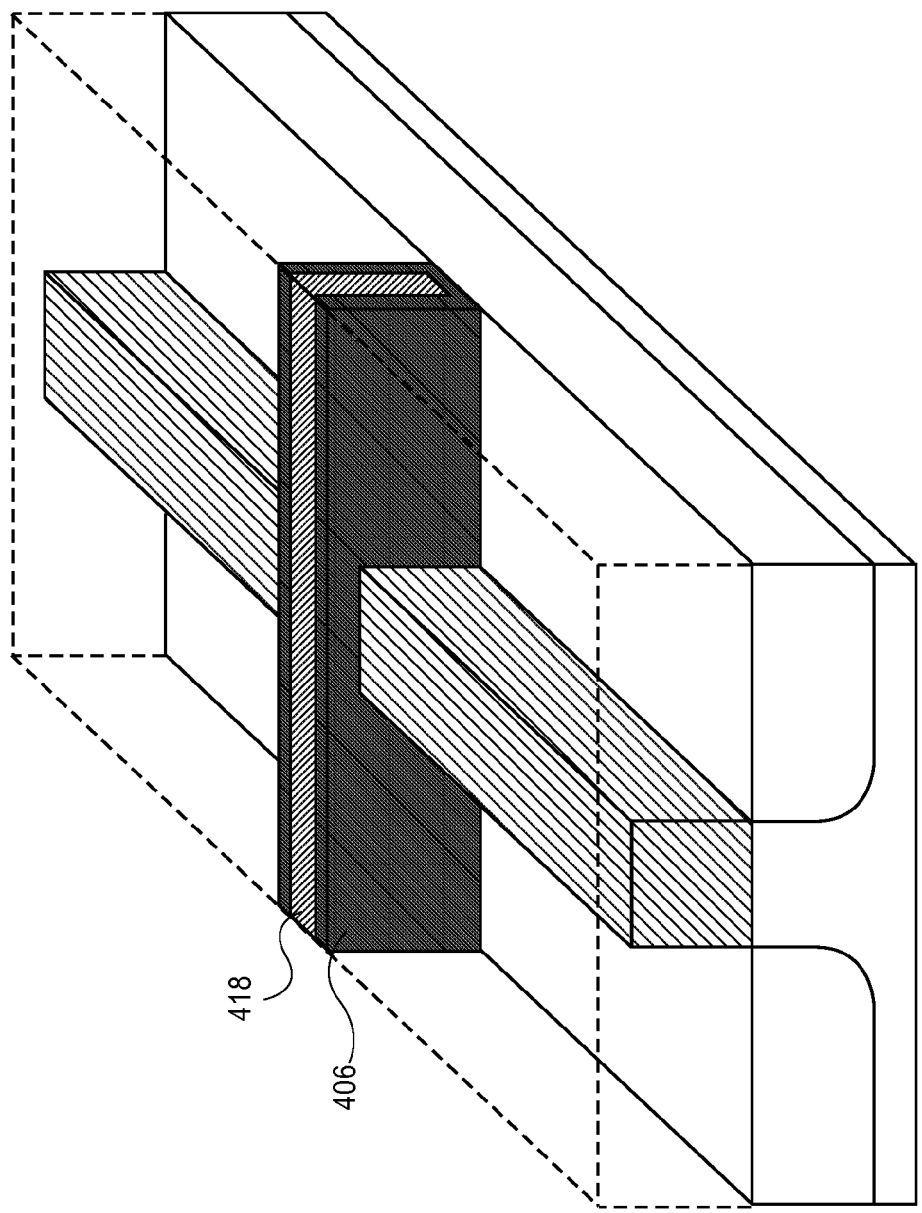

Referring to FIG. 4A, a dielectric gate stack placeholder 432 is formed above a three-dimensional substrate 402 comprising a bulk semiconductor portion 402A and an isolation portion 402B. Etched-out regions 440 are formed in the exposed portions of bulk semiconductor portion 402A of three-dimensional substrate 402, as depicted in FIG. 4B. In accordance with an embodiment of the present invention, a channel region 404 is retained underneath dielectric gate stack placeholder 432. Referring to FIG. 4C, strain-inducing epitaxial source/drain regions 408 are formed selectively in etched-out regions 440, directly adjacent to channel region 404 and in direct contact with dielectric gate stack placeholder 432. A blanket dielectric layer 450 is then deposited above dielectric gate stack placeholder 432, strain-inducing epitaxial source/drain regions 408 and isolation portion 402B of three-dimensional substrate 402, as depicted in FIG. 4D. Referring to FIG. 4E, blanket dielectric layer 450 and the top portion of dielectric gate stack placeholder 43 are planarized to form inter-layer dielectric film 410 and planarized dielectric gate stack placeholder 434. Planarized dielectric gate stack placeholder 434 is then removed to form trench 460 in inter-layer dielectric film 410 and to expose channel region 404, as depicted in FIG. 4F. Referring to FIG. 4G, a gate dielectric layer 406 and a gate electrode 418 are then formed in trench 460. Therefore, tipless strain-inducing epitaxial source/drain regions may be incorporated into a trigate device by using a dielectric gate stack placeholder in a replacement gate integration scheme. The trigate device may be incorporated into an integrated circuit by conventional processing steps, as known in the art.

Figure 5A:
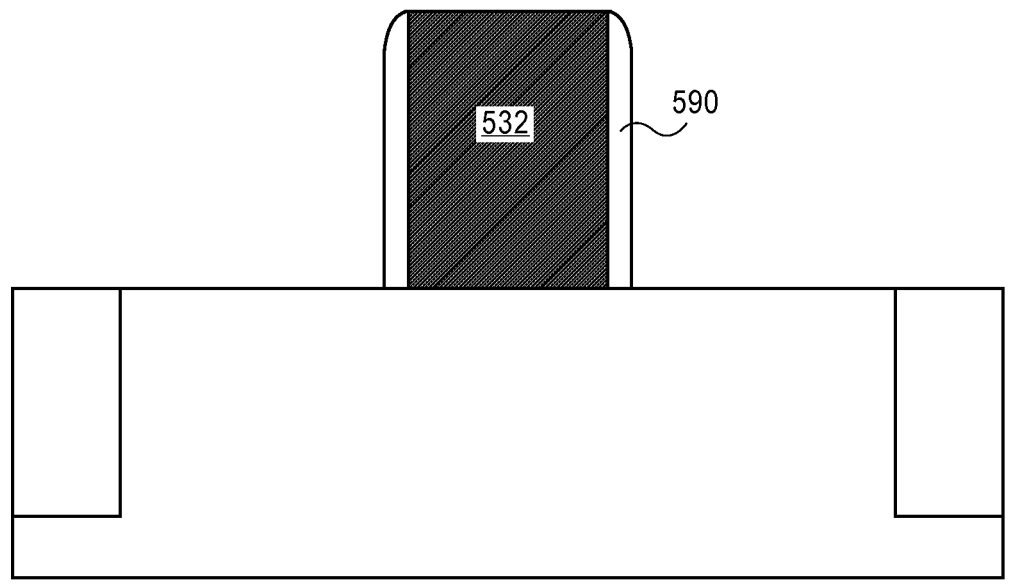
FIGS. 5A-B illustrate cross-sectional views representing the formation of a planar MOS-FET having tipless epitaxial source/drain regions and dielectric spacers, in accordance with an embodiment of the present invention.
Figure 5B:
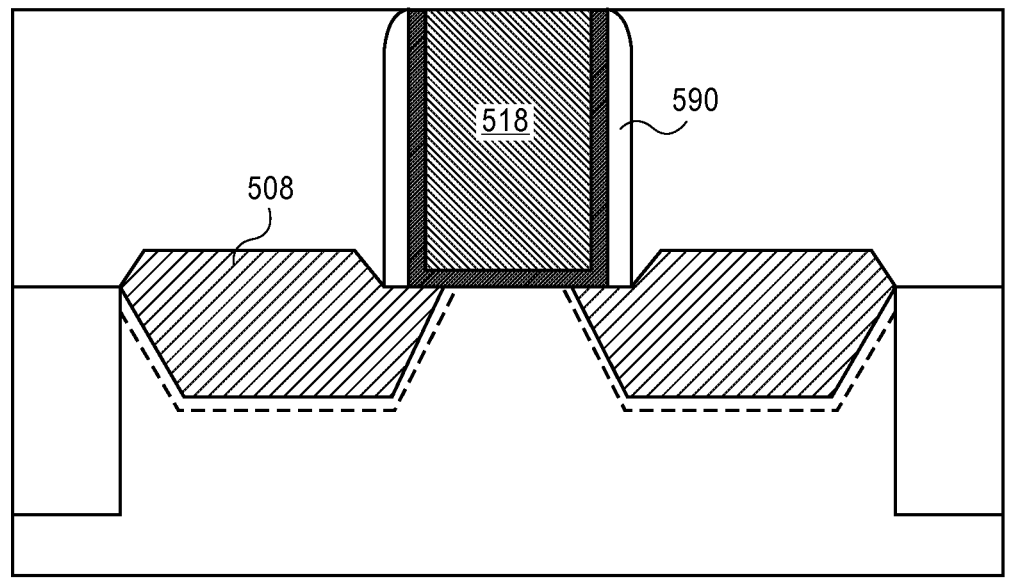

The present invention is also not limited to the formation of spacer-free semiconductor devices. A semiconductor gate stack placeholder may be used having thin outside dielectric spacers that inhibit deposition on the semiconductor gate stack placeholder during an epitaxial growth process. FIGS. 5A-B illustrate cross-sectional views representing the formation of a planar MOS-FET having tipless epitaxial source/drain regions and dielectric spacers, in accordance with an embodiment of the present invention.

Referring to FIG. 5A, a semiconductor gate stack placeholder 332 is provided having dielectric sidewall spacers 590. This structure corresponds with FIG. 3B, described above, but with the added feature of dielectric sidewall spacers. In one embodiment, semiconductor gate stack placeholder 332 is comprised substantially of polycrystalline silicon and dielectric sidewall spacers 590 are comprised substantially of a dielectric material. Referring to FIG. 5B, strain-inducing epitaxial source/drain regions 508 are formed on either side of dielectric sidewall spacers 590 and undercut both dielectric sidewall spacers 590 and replacement gate electrode 518. This structure corresponds with FIG. 3J, described above, but with the added feature of dielectric sidewall spacers.

Thus, a semiconductor device having tipless epitaxial source/drain regions and a method for its formation have been disclosed. In an embodiment, the semiconductor device comprises a gate stack on a substrate. The gate stack is comprised of a gate electrode above a gate dielectric layer and is above a channel region in the substrate. The semiconductor device also comprises a pair of source/drain regions in the substrate on either side of the channel region. The pair of source/drain regions is in direct contact with the gate dielectric layer and the lattice constant of the pair of source/drain regions is different than the lattice constant of the channel region. In one embodiment, the semiconductor device is formed by using a dielectric gate stack placeholder.

What is claimed is:

1. A semiconductor device, comprising:
    a gate stack disposed on a substrate, wherein said gate stack is comprised of a metal gate electrode above a channel region in said substrate, and a high-k gate dielectric layer between said metal gate electrode and said channel region and along sidewalls of said metal gate electrode;
    an inter-layer dielectric film directly adjacent to portions of said high-k gate dielectric layer along the sidewalls of said metal gate electrode;
    a pair of source/drain regions in said substrate on either side of said channel region, wherein said pair of source/drain regions is in direct contact with said high-k gate dielectric layer, and wherein a lattice constant of said pair of source/drain regions is different than a lattice constant of said channel region, said pair of source/drain regions having an undercut profile of approximately 55 degrees with respect to a horizontal axes; and
    regions of boron out-diffusion in said substrate and adjacent to a periphery of said pair of source/drain regions, wherein the regions of boron out-diffusion have a concentration of boron atoms approximately in the range of $1 \times 10^{17}$-$5 \times 10^{20}$ atoms/cm$^3$.

2. The semiconductor device of claim 1, wherein said channel region is comprised substantially of silicon atoms, and wherein said pair of source/drain regions is comprised substantially of silicon/germanium having an atomic concentration of germanium atoms in the range of 20-35%.

3. The semiconductor device of claim 1, wherein the lattice constant of said pair of source/drain regions is different than the lattice constant of said channel region by a factor of at least 0.1%.

4. The semiconductor device of claim 1, wherein the pair of source/drain regions is a pair of strain-inducing source/drain regions.

5. The semiconductor device of claim 4, wherein the pair of strain-inducing source/drain regions is a pair of tipless strain-inducing epitaxial source/drain regions.

6. The semiconductor device of claim 1, wherein the high-k gate dielectric layer comprises a material selected from the group consisting of hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, and a combination thereof.

7. The semiconductor device of claim 1, wherein the metal gate electrode comprises a metal-containing layer selected from the group consisting of metal nitrides, metal carbides, metal silicides, metal aluminides, hafnium, zirconium, titanium, tantalum, aluminum, ruthenium, palladium, platinum, cobalt, nickel, and conductive metal oxides.

8. The semiconductor device of claim 1, wherein the semiconductor device is a spacer-free semiconductor device.

9. The semiconductor device of claim 1, wherein the inter-layer dielectric film comprises carbon-doped silicon oxide having a dielectric constant in the range of 2.5-4.

10. A non-planar semiconductor device, comprising:
- a gate stack disposed on a substrate, wherein said gate stack is comprised of a metal gate electrode above a three-dimensional channel region in said substrate, and a high-k gate dielectric layer between said metal gate electrode and said three-dimensional channel region and along sidewalls of said metal gate electrode;
- an inter-layer dielectric film directly adjacent to portions of said high-k gate dielectric layer along the sidewalls of said metal gate electrode;
- a pair of source/drain regions in said substrate on either side of said three-dimensional channel region, wherein said pair of source/drain regions is in direct contact with said high-k gate dielectric layer, and wherein a lattice constant of said pair of source/drain regions is different than a lattice constant of said three-dimensional channel region, said pair of source/drain regions having an undercut profile of approximately 55 degrees with respect to a horizontal axes; and
- regions of boron out-diffusion in said substrate and adjacent to a periphery of said pair of source/drain regions, wherein the regions of boron out-diffusion have a concentration of boron atoms approximately in the range of $1\times10^{17}$-$5\times10^{20}$ atoms/cm$^3$.

11. The non-planar semiconductor device of claim 10, wherein said three-dimensional channel region is comprised substantially of silicon atoms, and wherein said pair of source/drain regions is comprised substantially of silicon/germanium having an atomic concentration of germanium atoms in the range of 20-35%.

12. The non-planar semiconductor device of claim 10, wherein the lattice constant of said pair of source/drain regions is different than the lattice constant of said three-dimensional channel region by a factor of at least 0.1%.

13. The non-planar semiconductor device of claim 10, wherein the pair of source/drain regions is a pair of strain-inducing source/drain regions.

14. The non-planar semiconductor device of claim 13, wherein the pair of strain-inducing source/drain regions is a pair of tipless strain-inducing epitaxial source/drain regions.

15. The non-planar semiconductor device of claim 10, wherein the high-k gate dielectric layer comprises a material selected from the group consisting of hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, and a combination thereof.

16. The non-planar semiconductor device of claim 10, wherein the metal gate electrode comprises a metal-containing layer selected from the group consisting of metal nitrides, metal carbides, metal silicides, metal aluminides, hafnium, zirconium, titanium, tantalum, aluminum, ruthenium, palladium, platinum, cobalt, nickel, and conductive metal oxides.

17. The non-planar semiconductor device of claim 10, wherein the semiconductor device is a spacer-free semiconductor device.

18. The non-planar semiconductor device of claim 10, wherein the inter-layer dielectric film comprises carbon-doped silicon oxide having a dielectric constant in the range of 2.5-4.

* * * * *